(12) United States Patent
Chang

(10) Patent No.: US 8,623,689 B2
(45) Date of Patent: Jan. 7, 2014

(54) PACKAGE PROCESS OF BACKSIDE ILLUMINATION IMAGE SENSOR

(75) Inventor: Wen-Hsiung Chang, Hsinchu (TW)

(73) Assignee: Ineffable Cellular Limited Liability Company, Wilmington, DE (US)

( * ) Notice: Subject to any disclaimer, the term of this patent is extended or adjusted under 35 U.S.C. 154(b) by 68 days.

(21) Appl. No.: 12/831,386

(22) Filed: Jul. 7, 2010

(65) Prior Publication Data
US 2012/0009716 A1  Jan. 12, 2012

(51) Int. Cl.
*H01L 21/00* (2006.01)
(52) U.S. Cl.
USPC .......................................................... 438/67
(58) Field of Classification Search
USPC .................... 257/447, 99, 100; 438/64–67
See application file for complete search history.

(56) References Cited

U.S. PATENT DOCUMENTS 7,528,420 B2 * 5/2009 Weng et al. ..................... 257/98
7,919,348 B2 * 4/2011 Akram et al. ................... 438/64

OTHER PUBLICATIONS

Non-Final Office Action on U.S. Appl. No. 13/668,245, mailed Jul. 12, 2013.

* cited by examiner

*Primary Examiner* — Jenny L Wagner

(57) ABSTRACT

In a package process of backside illumination image sensor, a wafer including a plurality of pads is provided. A first carrier is processed to form a plurality of blind vias therein. The first carrier is adhered to the wafer so that the blind vias face to the pads correspondingly. A spacing layer is formed and a plurality of sensing components are disposed. A second carrier is adhered on the spacing layer. Subsequently, a carrier thinning process is performed so that the blind vias become the through holes. An insulating layer is formed on the first carrier. An electrically conductive layer is formed on the insulating layer and filled in the though holes to electrically connect to the pads. The package process can achieve the exact alignment of the through holes and the pads, thereby increasing the package efficiency and improving the package quality.

17 Claims, 5 Drawing Sheets

PACKAGE PROCESS OF BACKSIDE ILLUMINATION IMAGE SENSOR

BACKGROUND

1. Field of the Invention

The present invention relates to an image sensor, and particularly to a package process of a backside illumination image sensor.

2. Description of the Related Art

Image sensor has a function of transforming the received optical signals into the electrical signals, and is widely used in various digital image electronic products. A conventional image sensor includes a semiconductor substrate and a sensing component disposed on the semiconductor substrate. Furthermore, the sensing component is covered by a plurality of metallic circuit layers disposed over the semiconductor substrate. The light entering the conventional image sensor must penetrate the metallic circuit layers before arriving at the sensing component. Thus, the light sensitive ability of the sensing component is limited. Recently, in order to improve the light sensitive ability of the image sensor, a backside illumination image sensor is being researched. The backside illumination image sensor includes a sensing component disposed on the rear surface of the semiconductor substrate. A front surface of the semiconductor substrate is only used for disposing a plurality of metallic circuit layers thereon. Because the sensing component of the backside illumination image sensor is not covered by the metallic circuit layers, the sensing component can sense more light. Thus, the light sensitive ability of the image sensor can be improved.

A current package process of the backside illumination image sensor includes the steps of: adhering the semiconductor substrate to a carrier, disposing the sensing component on the semiconductor substrate, forming the metallic circuit layers on the carrier, and so on. Generally, after the semiconductor substrate is adhered to the carrier, the following steps are performed. Thus, the metallic layers formed on the carrier are electrically connected to the semiconductor substrate. First, a plurality of holes corresponding to a plurality of pads on the semiconductor substrate are formed. Then, a metallization process is applied to the holes to form the conductive holes and metallic circuit layers. However, the pads on the semiconductor substrate are invisible after the semiconductor substrate is adhered to the carrier. Thus, it is difficulty to align of the drilling positions of the holes and the pads. As a result, the current package process of the backside illumination image sensor has a low the package efficiency. Furthermore, the inexact alignment of the drilling positions of the holes and the pads will affect the package quality the backside illumination image sensor.

Therefore, what is needed is a package process of a backside illumination image sensor to overcome the above disadvantages.

BRIEF SUMMARY

The present invention provides a package process of a backside illumination image sensor to reducing the alignment difficulty in the package process, thereby increasing the package efficiency and improving the package quality.

To achieve the above-mentioned advantages, an embodiment of the present invention provides a package process of a backside illumination image sensor. In the package process, a wafer including a first surface and a second surface opposite to the first surface is provided. The first surface has a plurality of pads disposed thereon. A first carrier is processed to form a plurality of blind vias therein. The first carrier includes a front surface and a rear surface opposite to the front surface. The blind vias define a plurality of openings on the front surface. The front surface of the first carrier is adhered to the first surface of the wafer so that the blind vias face to the pads correspondingly. A spacing layer is formed on the second surface of the wafer. The spacing layer includes at least an open region to expose the second surface therefrom. A plurality of sensing components are disposed in the at least an open region. A second carrier is adhered on the spacing layer. A carrier thinning process is performed so that the blind vias become the through holes penetrating the thinned first carrier to expose the pads therefrom. An insulating layer is formed on the first carrier to cover the rear surface and the sidewalls of the through holes. An electrically conductive layer is formed on the insulating layer and filled in the though holes so that the electrically conductive layer is electrically connected to the pads.

In one embodiment of the present invention, the step of processing the first carrier includes providing the first carrier, forming an oxide layer on the front surface of the first carrier, and removing a portion of the oxide layer and forming the blind vias in the first carrier. In one embodiment of the present invention, the step of removing the portion of the oxide layer and forming the blind vias in the first carrier includes an etching process or a drilling process. In one embodiment of the present invention, the first carrier is a silicon substrate, and the oxide layer is a silicon oxide layer.

In one embodiment of the present invention, the step of disposing the sensing components includes disposing a photodiode on the second surface of the wafer, forming a color filter over the photodiode, and disposing a micro lens over the color filter.

In one embodiment of the present invention, the second carrier is a transparent substrate.

In one embodiment of the present invention, before the spacing layer is formed, the package process of the backside illumination image sensor further includes a wafer thinning process. The wafer thinning process includes grinding the second surface of the wafer to form a grinding surface and etching the grinding surface of the wafer.

In one embodiment of the present invention, the insulating layer is a silicon oxide layer.

In one embodiment of the present invention, the step of forming the insulating layer includes forming an insulating material on the rear surface of the first carrier to cover the rear surface, the pads and the sidewalls of the through holes, and etching the insulating material to remove the portions of the insulating material on the pads. In one embodiment provided by the present invention, the insulating material is formed by using a chemical vapor deposition method.

In one embodiment of the present invention, the spacing layer is a patterned adhesive layer.

In one embodiment of the present invention, the step of adhering the front surface of the first carrier to the first surface of the wafer is performed in a vacuum condition.

To achieve the above-mentioned advantages, an embodiment of the present invention provides a package process of a backside illumination image sensor. In the package process, a wafer including a first surface and a second surface opposite to the first surface is provided. The first surface has a plurality of pads disposed thereon. A first carrier is processed to form a plurality of through holes therein. The first carrier includes a front surface and a rear surface opposite to the front surface. The through holes penetrate the front surface and the rear surface. The front surface of the first carrier is adhered to the first surface of the wafer so that the through holes face to the pads and expose the pads therefrom correspondingly. A spacing layer is formed on the second surface of the wafer. The spacing layer includes at least an open region to expose the second surface therefrom. A plurality of sensing components are disposed in the at least an open region. A second carrier is adhered on the spacing layer. An insulating layer is formed on the first carrier to cover the rear surface and the sidewalls of the through holes. An electrically conductive layer is formed on the insulating layer and filled in the though holes so that the electrically conductive layer is electrically connected to the pads.

In the package process of the backside illumination image sensor of the present invention, before the wafer is adhered to the first carrier, a plurality of blind vias or a plurality of through holes have been formed. Thus, when the wafer is adhered to the first carrier, only the alignment of the blind vias or the through holes and the pads is needed to be considered. In other words, during forming the through holes, it is not necessary to consider the alignment of the drilling positions of the through holes and the invisible pads. Thus, the alignment difficulty in the package process can be reduced, thereby achieving the exact alignment of the through hole and the pads. As a result, the package efficiency can be increased and the package quality can be improved.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Referring to FIG. 1A to FIG. 1H, FIG. 1A to FIG. 1H illustrate a process flow of a package process of a backside illumination image sensor in accordance with a first embodiment of the present invention.

Figure 1A:
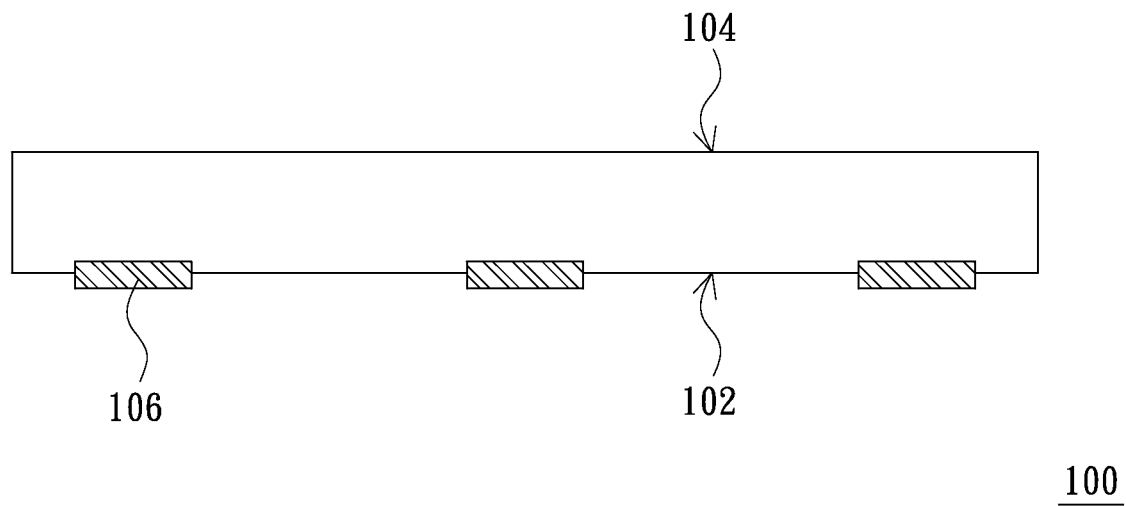
FIG. 1A to FIG. 1H illustrate a process flow of a package process of a backside illumination image sensor in accordance with a first embodiment of the present invention.

Referring to FIG. 1A, first, a wafer 100, for example, a semiconductor wafer, is provided. The wafer 100 includes a first surface 102 and a second surface 104 opposite to the first surface 102. The first surface 102 has a plurality of pads 106 disposed thereon.

Figure 1B:
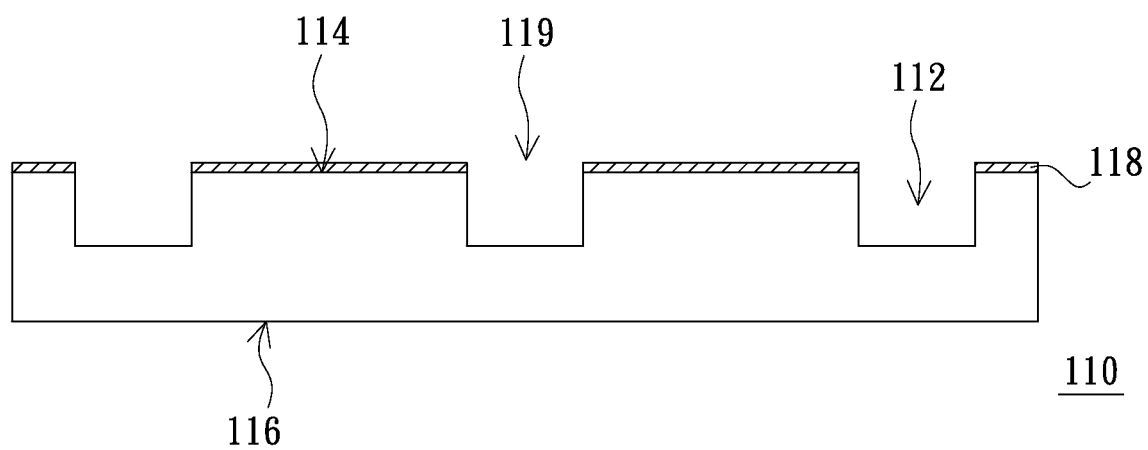

Referring to FIG. 1B, next, a first carrier 110 is processed to form a plurality of blind vias 112 therein. In detail, the first carrier 110 is provided. The first carrier 110 includes a front surface 114 and a rear surface 116 opposite to the front surface 114. An oxide layer 118 is formed on the front surface 114 of the first carrier 110. Then, the portions of the oxide layer 118 are removed and the blind vias 112 are formed by using an etching process. In other words, the portions of the oxide layer 118 are etched to be removed and the corresponding portions of the first carrier 110 are etched from the front surface 114 to form the blind vias 112. The blind vias 112 do not penetrate the front surface 114 and the rear surface 116. The blind vias 112 define a plurality of openings 119 on the front surface 114. In another embodiment, the step of removing the portions of the oxide layer 118 and forming the blind vias 112 can employ a drilling process, for example, a laser drilling process. In the present embodiment, the first carrier 110 is, but not limited to, a silicon substrate, and the oxide layer 118 is, but not limited to, a silicon oxide layer.

Figure 1C:
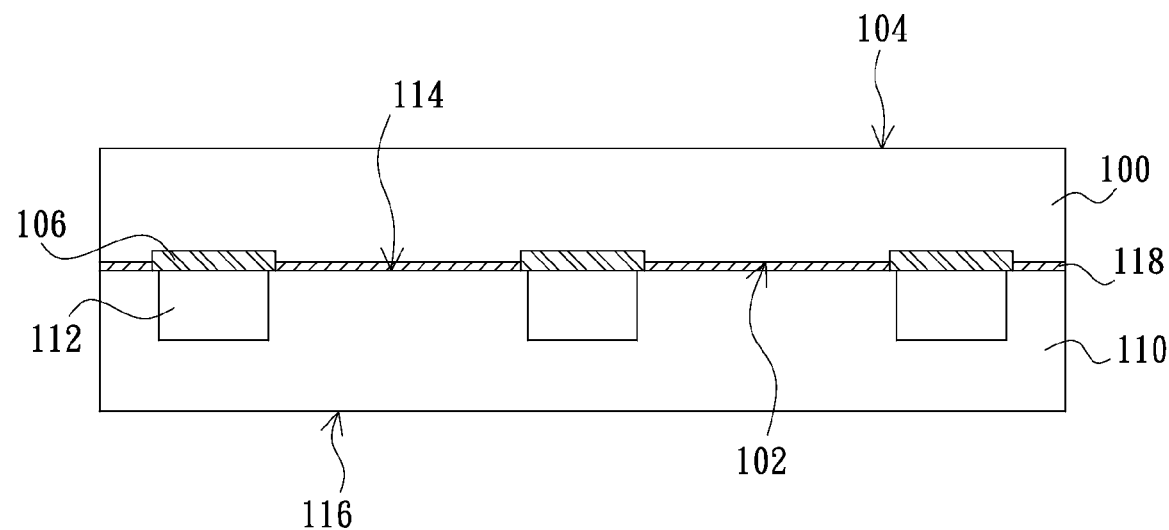

Referring to FIG. 1C, the front surface 114 of the first carrier 110 is adhered to the first surface 102 of the wafer 100 so that the blind vias 112 face to the pads 106 correspondingly. That is, the openings 119 on the front surface 114 of the blind vias 112 face to the pads 106 correspondingly. In other words, the pads 106 are exposed in the blind vias 112. The oxide layer 118 is located between the first surface 102 and the front surface 114. The oxide layer 118 can be configured for insulating the pads 106. In another embodiment, the first carrier 110 can be adhered to the wafer 100 with other insulating adhesive materials. It is noted that it is necessary to remove the insulating adhesive materials on the pads 106. In the present embodiment, the front surface 114 of the first carrier 110 is adhered to the first surface 102 of the wafer 100 in a vacuum condition, thereby avoiding air in the blind vias 112.

Figure 1D:
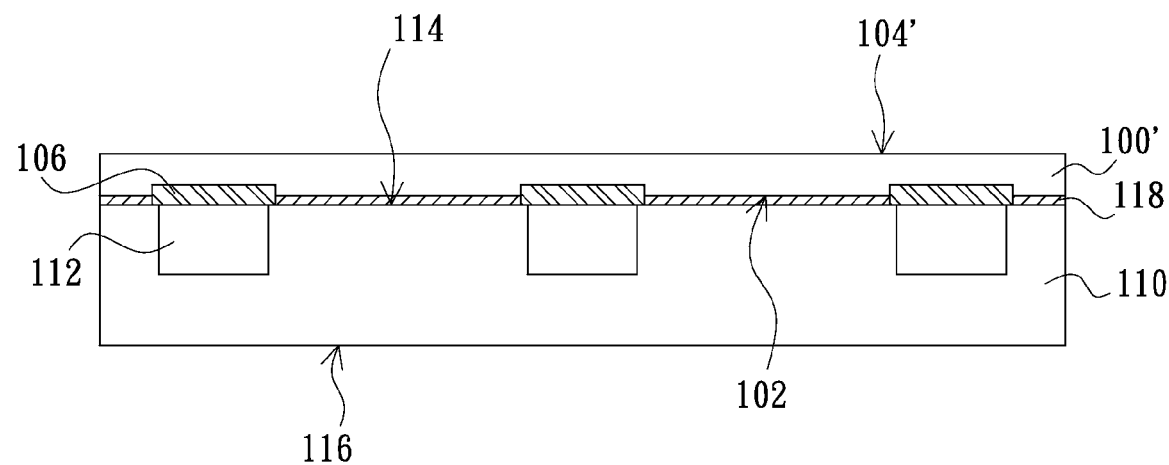

After the front surface 114 of the first carrier 110 is adhered to the first surface 102 of the wafer 100, a wafer thinning process can be performed selectively. Thus, the wafer 100 can have a suitable thickness. Referring to FIG. 1D, in the wafer thinning process, at first, the second surface 104 of the wafer 100 is ground to form a ground surface (not shown). The method for grinding the wafer 100 can be, for example, a milling method, a grinding method or a polishing method. Subsequently, the ground surface of the wafer 100 is etched, thereby obtaining a thinned wafer 100'. The thinned wafer 100' includes the first surface 102 and the second surface 104'.

Figure 1E:
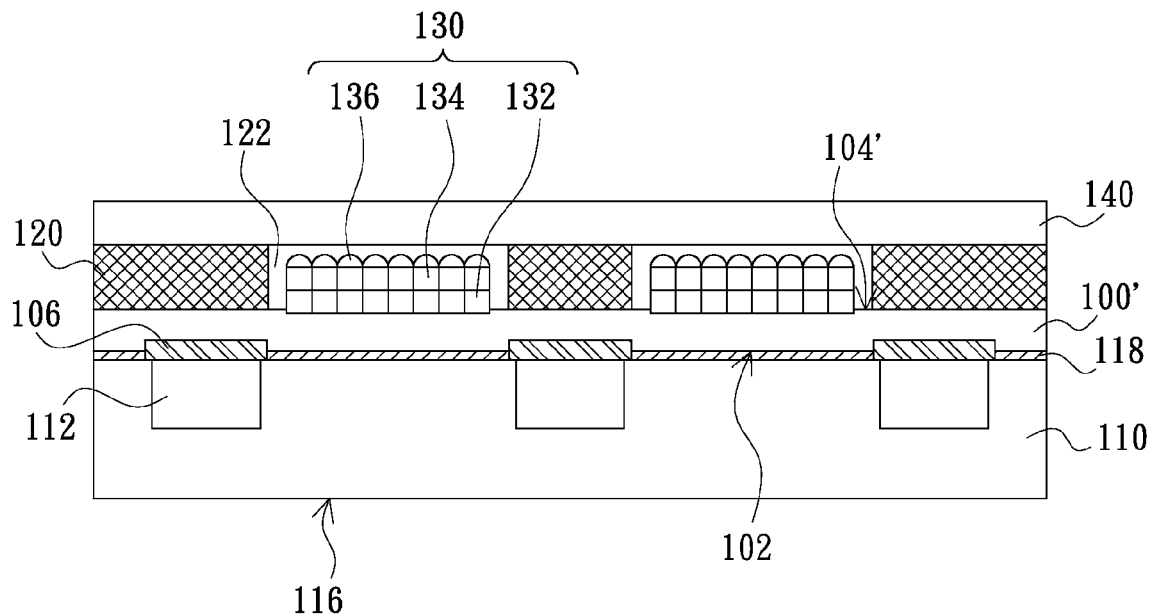

Referring to FIG. 1E, next, a spacing layer 120 is formed on the second surface 104' of the wafer 100'. The spacing layer 120 is configured for forming a distance between the first carrier 110 and the second carrier 140. The spacing layer 120 includes at least an open region 122. The second surface 104' of the wafer 100' is exposed from the at least an open region 122.

Referring to FIG. 1E, next, a plurality of sensing components 130 are disposed on the wafer 100' exposed from the at least an open region 122. The step of disposing the sensing components 130 is determined by difference of the sensing components 130. In the present embodiment, a sensing component 130 includes a photodiode 132, a color filter 134 and a micro lens 136. Thus, firstly, a photodiode 132 is disposed on the second surface 104' of the wafer 100' and embedded in the wafer 100'. Secondly, a color filter 134 is formed over the photodiode 132. Thirdly, a micro lens 136 is disposed over the color filter 134. Afterwards, a second carrier 140 is located over and adhered on the spacing layer 120. The second carrier 140 is a transparent substrate, for example, a glass substrate. In the present embodiment, the spacing layer 120 is a patterned adhesive layer. Thus, the second carrier 140 can be, but not limited to, directly adhered to the wafer 100' through the spacing layer 120. It is noted that the spacing layer 120 can also be other suitable structures.

Figure 1F:
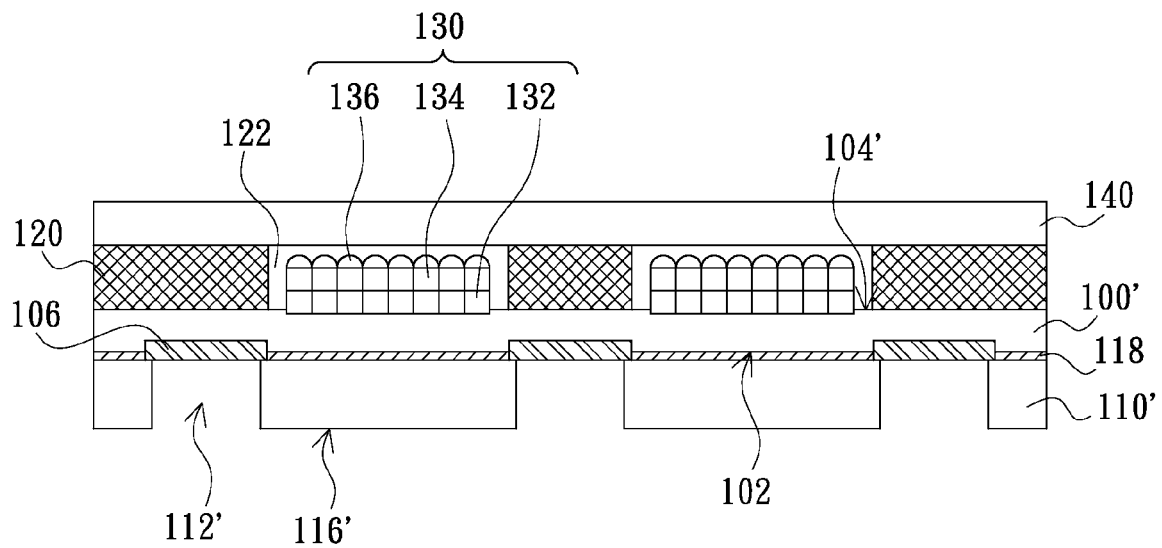

Referring to FIG. 1F, next, a carrier thinning process is applied to the rear surface 116 of the first carrier 110. Thus, the first carrier 110 can have a suitable thickness, thereby forming a thinned first carrier 110' having a rear surface 116'. Furthermore, after the carrier thinning process, the blind vias 112 of the first carrier 110 become through holes 112' penetrating the thinned first carrier 110'. In other words, the through holes 112' penetrating the front surface 114 and the rear surface 116', and the pads 106 are exposed from the through holes 112'. In the present embodiment, the method for thinning the first carrier 110 can be, for example, an etching method, a milling method, a grinding method or a polishing method.

Figure 1G:
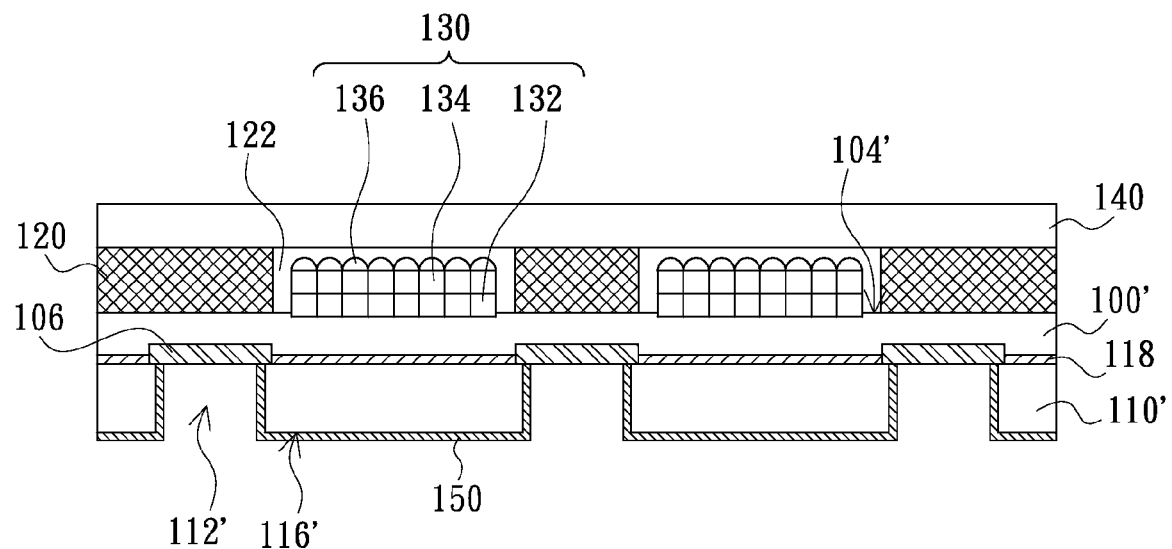

Referring to FIG. 1G, next, an insulating layer 150 is formed on the first carrier 110' to cover the rear surface 116' and the sidewalls of the through holes 112'. In the present embodiment, firstly, an insulating material is deposited on the first carrier 110' to cover the rear surface 116', the pads 106 and the sidewalls of the through holes 112'. The insulating material is, for example, a silicon oxide. Secondly, the insulating material is etched to remove the portions of the insulating material on the pads 106, thereby forming the insulating layer 150. In the present embodiment, the insulating material is deposited, but not limited to, by using a chemical vapor deposition method.

Figure 1H:
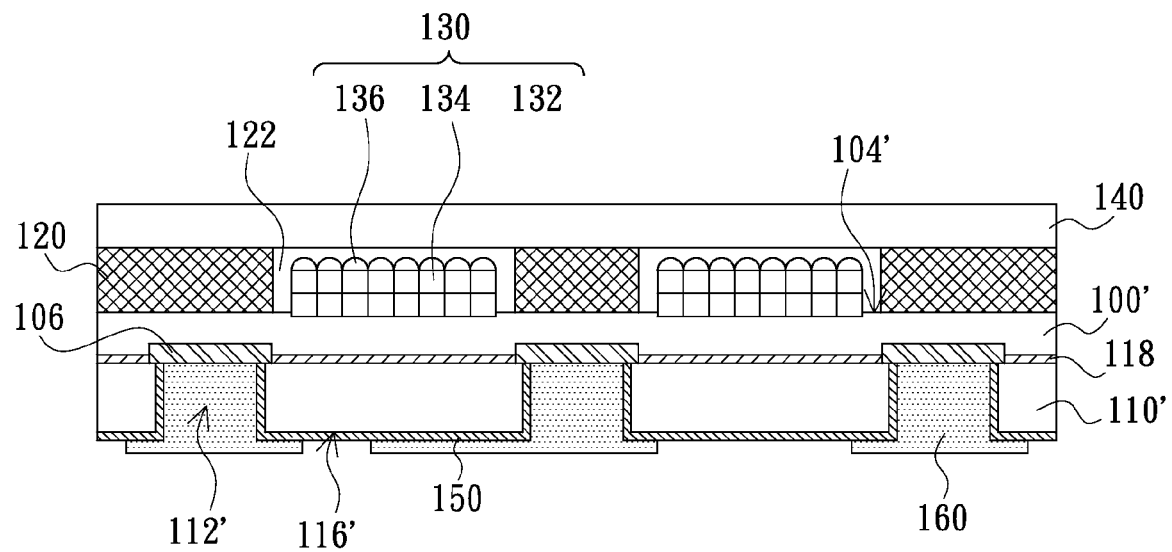

Referring to FIG. 1H, next, an electrically conductive layer 160 is formed on the insulating layer 150 and filled in the though holes 112' so that the electrically conductive layer 160 is electrically connected to the pads 106. The electrically conductive layer 160 is formed by either an electroplating method or a depositing method and is not described here.

Figure 2:
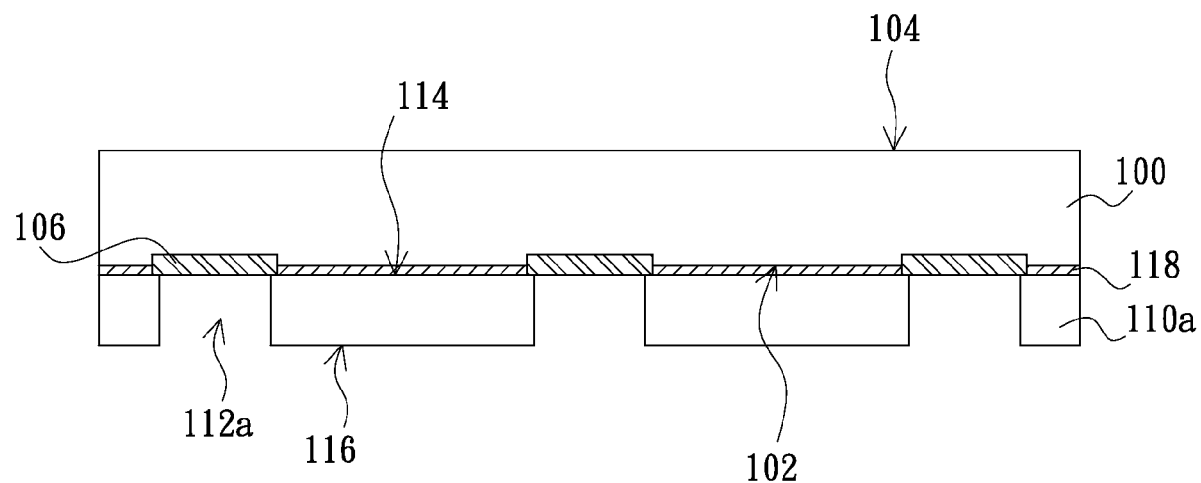
FIG. 2 is a schematic, cross-sectional view of a wafer adhering to a first carrier in a package process of a backside illumination image sensor in accordance with a second embodiment of the present invention.

FIG. 2 is a schematic, cross-sectional view of a wafer adhering to a first carrier in a package process of a backside illumination image sensor in accordance with a second embodiment of the present invention. The package process of the backside illumination image sensor in the second embodiment is similar to the package process of the backside illumination image sensor in the first embodiment except the step of processing the first carrier. Referring to FIG. 2, in detail, in the present embodiment, a first carrier 110a is processed to form a plurality of through holes 112a therein. The first carrier 110a includes a front surface 114 and a rear surface 116 opposite to the front surface 114. The through holes 112a penetrate the front surface 114 and the rear surface 116 of the first carrier 110a. Then, the front surface 114 of the first carrier 110a is adhered to the first surface 102 of the wafer 100 so that the through holes 112a face to the pads 106 correspondingly. Thus, the pads 106 are exposed from the through holes 112a correspondingly. Because the through holes 112a have been formed in the first carrier 110a, in the present embodiment, it is not necessary to apply a carrier thinning process to the first carrier 110a having a suitable thickness. It is noted that, a carrier thinning process can be selectively applied to the first carrier 110a having a thick thickness.

In summary, the present invention has at least the following advantages. Before the wafer is adhered to the first carrier, a plurality of blind vias or a plurality of through holes have been formed. Thus, when the wafer is adhered to the first carrier, only the alignment of the blind vias or the through holes and the pads is needed to be considered. In other words, during forming the through holes, it is not necessary to consider the alignment of the drilling positions of the through holes and the invisible pads. Thus, the alignment difficulty in the package process can be reduced, thereby achieving the exact alignment of the through hole and the pads. As a result, the package efficiency can be increased and the package quality can be improved.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of processing a wafer, the method comprising:
providing a wafer including a first surface and a second surface opposite to the first surface, wherein the first surface has a plurality of pads disposed thereon;
forming a plurality of blind vias within a first carrier, wherein the first carrier includes a front surface and a rear surface opposite to the front surface, and wherein the plurality of blind vias form a plurality of openings on the front surface;
adhering the front surface of the first carrier to the first surface of the wafer such that the plurality of blind vias face to the plurality of pads correspondingly and such that the plurality of pads are exposed in the plurality of blind vias, wherein said adhering the front surface of the first carrier to the first surface of the wafer comprises exposing at least one of the plurality of pads to an unfilled blind via; and
thinning the first carrier to expose the plurality of blind vias and the plurality of pads such that the plurality of blind vias pass through the first carrier.

2. The method of claim 1, wherein said forming a plurality of blind vias within a first carrier comprises:
forming an oxide layer on the front surface of the first carrier;
removing a portion of the oxide layer to expose a portion of the front surface of the first carrier; and
forming one of the plurality of blind vias within the exposed portion of the front surface of the first carrier.

3. The method of claim 2, wherein said removing a portion of the oxide layer and said forming one of the plurality of blind vias comprises an etching process or a drilling process.

4. The method of claim 2, wherein the first carrier comprises a silicon substrate, and wherein the oxide layer comprises a silicon oxide layer.

5. The method of claim 1, further comprising:
forming a spacing layer on the second surface of the wafer, wherein the spacing layer includes an open region to expose the second surface therefrom;
disposing a plurality of sensing components in the open region; and
adhering a second carrier on the spacing layer.

6. The method of claim 5, wherein said disposing a plurality of sensing components comprises:
disposing a photodiode on the second surface of the wafer;
forming a color filter over the photodiode; and
disposing a micro lens over the color filter.

7. The method of claim 5, wherein the second carrier comprises a transparent substrate.

8. The method of claim 5, further comprising performing a wafer thinning process prior to said forming a spacing layer, wherein the wafer thinning process comprises:
grinding the second surface of the wafer to form a grinding surface; and
etching the grinding surface.

9. The method of claim 5, wherein the spacing layer comprises a patterned adhesive layer.

10. The method of claim 1, further comprising, after said thinning the first carrier:
forming an insulating layer on the first carrier to cover the rear surface and sidewalls of through holes created by the plurality of blind vias; and
forming an electrically-conductive layer on the insulating layer within the though holes to electrically connect the electrically-conductive layer to the plurality of pads.

11. The method of claim 10, wherein the insulating layer comprises a silicon oxide layer.

12. The method of claim 10, wherein said forming an insulating layer comprises:
- forming an insulating material on the rear surface of the first carrier to cover the rear surface, the plurality of pads, and the sidewalls of the through holes; and
- etching the insulating material to remove portions of the insulating material on the plurality of pads.

13. The method of claim 12, wherein the insulating material is formed by using a chemical vapor deposition method.

14. The method of claim 1, wherein said adhering the front surface of the first carrier to the first surface of the wafer is performed in a vacuum condition.

15. A method of processing a wafer, the method comprising:
- providing a wafer including a first surface and a second surface opposite to the first surface, wherein the first surface has a plurality of pads disposed thereon;
- forming a plurality of blind vias within a first carrier, wherein the first carrier includes a front surface and a rear surface opposite to the front surface, and wherein the plurality of blind vias form a plurality of openings on the front surface;
- adhering the front surface of the first carrier to the first surface of the wafer such that the plurality of blind vias face to the plurality of pads correspondingly and such that the plurality of pads are exposed in the plurality of blind vias, wherein the plurality of blind vias are devoid of electrically-conductive material during said adhering the front surface of the first carrier to the first surface of the wafer; and
- thinning the first carrier to expose the plurality of blind vias and the plurality of pads such that the plurality of blind vias pass through the first carrier.

16. A method of processing a wafer, the method comprising:
- providing a wafer including a first surface and a second surface opposite to the first surface, wherein the first surface has a plurality of pads disposed thereon;
- forming a plurality of blind vias within a first carrier, wherein the first carrier includes a front surface and a rear surface opposite to the front surface, and wherein the plurality of blind vias form a plurality of openings on the front surface;
- adhering the front surface of the first carrier to the first surface of the wafer such that the plurality of blind vias face to the plurality of pads correspondingly and such that the plurality of pads are exposed in the plurality of blind vias, wherein the plurality of blind vias are unfilled during said adhering the front surface of the first carrier to the first surface of the wafer; and
- thinning the first carrier to expose the plurality of blind vias and the plurality of pads such that the plurality of blind vias pass through the first carrier.

17. The method of claim 1, further comprising, after said thinning the first carrier, forming an electrically-conductive material within at least one of the plurality of blind vias, wherein the electrically-conductive material is in physical contact with at least one of the plurality of pads.

* * * * *

UNITED STATES PATENT AND TRADEMARK OFFICE
CERTIFICATE OF CORRECTION

| | | |
|---|---|---|
| PATENT NO. | : 8,623,689 B2 | Page 1 of 1 |
| APPLICATION NO. | : 12/831386 | |
| DATED | : January 7, 2014 | |
| INVENTOR(S) | : Chang | |

It is certified that error appears in the above-identified patent and that said Letters Patent is hereby corrected as shown below:

In the Specification

In Column 1, Line 45, delete "difficulty" and insert -- difficult --, therefor.

Signed and Sealed this
Twenty-ninth Day of April, 2014

Michelle K. Lee
*Deputy Director of the United States Patent and Trademark Office*